United States Patent [19]

Wiseman et al.

[11] Patent Number: 4,711,791
[45] Date of Patent: Dec. 8, 1987

[54] METHOD OF MAKING A FLEXIBLE MICROCIRCUIT

[75] Inventors: Charles D. Wiseman, Cottage Grove; William M. Theisen, Madison, both of Wis.

[73] Assignee: The BOC Group, Inc., Montvale, N.J.

[21] Appl. No.: 892,514

[22] Filed: Aug. 4, 1986

[51] Int. Cl.⁴ .............................. B05D 5/12
[52] U.S. Cl. ........................ 427/96; 437/245
[58] Field of Search .................... 427/96, 90, 88

[56] References Cited

U.S. PATENT DOCUMENTS

| | | | |
|---|---|---|---|
| 3,881,884 | 5/1975 | Cook | 427/89 |
| 4,108,717 | 8/1978 | Widmann | 427/96 |
| 4,152,195 | 5/1979 | Bahrle | 427/96 |
| 4,200,668 | 4/1980 | Segal | 427/10 |
| 4,508,813 | 4/1985 | Nakagawa | 430/311 |
| 4,563,407 | 1/1986 | Matsui | 430/5 |

FOREIGN PATENT DOCUMENTS 2138025A 10/1984 United Kingdom ................. 427/88

Primary Examiner—John D. Smith
Assistant Examiner—Vi Duong Dang
Attorney, Agent, or Firm—Roger M. Rathbun; Larry W. Cassett

[57] ABSTRACT

A method is disclosed for producing a flexible microcircuit of a size usable in vivo in the arterial or venous tract of a human. The method comprises forming, by various photoresist techniques, conductive runs on a polyimide base of about 1-2 mils thickness. Each end of a flexible microcircuit has minute holes formed therein for connection to an electronic chip and to hard wiring. The method produces holes in the conductive runs for the electronic chip connection of about 0.002 inches in diameter and holes about 0.016 inches in diameter at the end for wiring.

5 Claims, 11 Drawing Figures

METHOD OF MAKING A FLEXIBLE MICROCIRCUIT

BACKGROUND OF THE INVENTION

This invention relates to a method of producing a flexible microcircuit having conductive paths or runs for connection between a device such as a semiconductor and a connector for joining with hard wiring.

There are, of course, many methods of fabricating flexible microcircuits and which include processing steps with photoresist methods to produce conductive runs therein. Many, however, are not optimized or are used with larger flexible circuits that can be more easily produced in commercial quantities.

In particular, it has been difficult to fabricate a flexible microcircuit of the size usable in attaching a distal end thereof to a semiconductor device, such as a JFET or ISFET to produce a freely suspended device on the end of the flexible microcircuit. The flexible microcircuit for such use must be specifically manufactured and must have, at its distal ends extremely minute holes for providing connection with the semiconductor device.

An example of such a semiconductor device is in U.S. Pat. No. 4,180,771 of Guckel et al. Such devices are capable of being introduced into a person's blood stream for in vivo measurements of pH etc., therefore, must be extremely minute as well as flexible so that the semiconductor device, as well as the flexible circuit holding that device can enter the patient's blood stream without creating a hazardous interference with the natural flow of blood therein.

The distal end of such a flexible microcircuit to be connected to the JFET must have a plurality of holes having diameters of about 0.002" in order to be connectible thereto, and the proximal end thereof adaptable for connection to hard wiring devices. Because of the size of the microcircuit itself and the requirement for extremely minute yet accurately positioned holes, the fabrication of such microcircuit is difficult.

SUMMARY OF THE INVENTION

In accordance with the invention a method of producing a flexible microcircuit is provided that can be used to produce a circuit that can be utilized for freely suspending a semiconductor device or chip on the distal end and which is sufficiently minute so as to be introducible into the blood stream of a living patient. The method produces a flexible microcircuit having holes at its distal end of about 0.002 inches in diameter and has conductive runs for providing electrical connection from the distal end to the proximal end where hard wire connections can be accomplished.

The method comprises coating base polyimide material onto a silver coated silicon substrate to a predetermined thickness. The polyimide is thus the main composition of the flexible microcircuit and on which the conductive runs are formed. By photographic techniques and masking, a photoresist surface is created on the base polyimide everywhere on that surface were no subsequent metallic surfaces are desired, i.e. the conductive runs and contact areas. A coating of aluminum is thereafter applied to a predetermined thickness to the entire polyimide surface by evaporation.

Next, the photoresist is dissolved and, therefore, removes all of the aluminum coated surface covering the photoresist, that is, all of the polyimide surface where metallic surfaces are not desired. Upon removal of such surface area the remaining aluminum coating on the polyimide surface is in the form of the desired conductive runs and surfaces for connections.

A thin layer of chromium is then deposited to a predetermined thickness over the entire surface of the polyimide material thus coating both the conductive area (runs) and the nonmetallic surface area.

Another photoresist mask surface is applied to the surface of the chromium; this time the mask surface is applied to form the pattern of the desired holes in the conductive runs and to form the outside pattern of the flexible microcircuit itself; that is, the mask area is created in the shape of tiny holes for later use in applying the semiconductor device to the distal end and for hard wire connection to the proximal end. Also, the mask surrounds the external desired shape of the end product flexible microcircuit.

The chrome surface is thereafter etched away, due to the photoresist mask, such that only areas where the mask has been formed are effected by the etch. Thus, the tiny holes are etched down to the aluminum coating and the overall shape is formed by the etch eroding the chromium surrounding the periphery of the desired final shape down to the polyimide.

The aluminum is then etched away, therefore, the area where the holes are desired are removed. As such, therefore, those areas where the aluminum has been removed expose the base polyimide material.

The polyimide in those exposed areas is thereafter removed by an oxygen plasma etch thus completing formation of the holes in the flexible microcircuit and removing the surrounding polyimide in order to leave polyimide in the desired shape still affixed to the silver coated silicon substrate.

The entire unit is then chrome etched and which removes the chrome mask and also attacks the silver surface such that microcircuit frees from the silicon substrate and the final flexible microcircuit is thus completed and which comprises a polyimide base material upon which are formed aluminum runs with minute accurate holes for connections at the distal and proximal ends. The techniques of the present invention can readily be used to produce a microcircuit approximately 1–2 mils thick less than 20 mils in width, and about 2.5 inches in length.

DESCRIPTION OF THE PREFERRED EMBODIMENT

Figure 1:
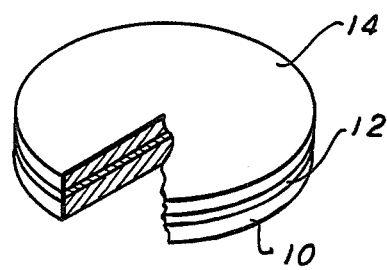
FIG. 1 is a perspective view, partially cut away, of a typical wafer on which the microcircuit of the present invention is formed.

In FIG. 1, there is shown a perspective view, partly in section, of a wafer that is used for formation of a flexible microcircuit in accordance with the present invention. As shown, the overall wafer comprises a base wafer 10, preferably of silicon, which is readily commercially available and are typically approximately 2 inches in diameter and about 10 mils thick. Such commercial wafers 10 can be purchased preferably having one side polished, the other side may but need not be polished.

The base wafer 10 may be other materials than silicon that is not attacked by the various etching steps employed herein and which preferably have at least one smooth surface. As described herein, only one flexible microcircuit is illustrated on base wafer 10 for clarity, however, in practice, a plurality are formed on a typical 2 inch diameter wafer.

To prepare the base wafer 10 for the further steps of the invention, a silver coating 12 is vacuum evaporated by conventional techniques on to the base wafer 10.

The silver coating 12 is approximately 1 micron in thickness and the silver is coated on to the polished side of base wafer 10.

On to the silver coating 12, is applied a polyimide layer 14. Various techniques may be employed to apply the polyimide layer 14 however, the preferred technique is to spin coat the polyimide in a commercial spin coating machine, one of which that is suitable is Model EO-101 photoresist spinner available from Headway Research of Garland, Tex. In applying the polyimide layer 14 with a spin coater, the wafer is placed on a spinner in the spin coater with the silver coating 12 facing upwardly. Base polyimide material itself is commercially available as a thick, syrup-like liquid, one of such commercial suppliers is E. I. Du Pont De Nemours & Company. The silver coating 12 is flooded with polyimide and then spun at approximately 4000 rpm for about 30 seconds in order to form a polyimide layer 14 of about 35 micrometers. After coating, the polyimide material is cured by heating, a typical heating cycle comprises an oven bake at about 80° C. for fifteen minutes followed by setting the wafer on a hot plate and increasing the temperature in discrete steps up to 300° F. in about ½ hour, all of which should be handled in a dust-free atmosphere.

The precise curing of the polyimide may be done in various heating steps, by oven heating alone or by heating on the hot plate alone. Generally, instructions on the amount cure necessary are provided by the manufacturers of the particular polyimide utilized.

The final wafer has a fully cured polyimide layer 14 of about 35 microns uniformly distributed atop the silver coating 12.

Figure 2:
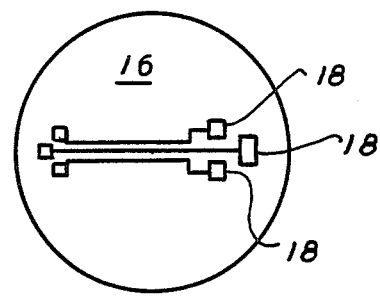
FIG. 2 is a plan view of the wafer of FIG. 1 illustrating one of the steps of the invention.

Turning now to FIG. 2, a series of steps is commenced utilizing photoresist techniques to form the flexible microcircuit. Next, a photoresist material, one of which that may be used is a material identified as AZ-1350-J supplied commercially by Shipley Company of Newton, Mass. is spun on, to the completed wafer with the cured polyimide layer 14. That material is spin coated at about 4000 rpm for a time of between about 10 to about 30 seconds. The photoresist is thereafter semi-cured by baking for about five minutes at 60° C. in a dust free atmosphere.

The photoresist material 16 now covering the entire polyimide layer 14 is thereafter exposed to light under a mask. The mask is designed such that light does not reach the photoresist except in certain surface areas. As shown in FIG. 2, only the areas 16 received the light. Typically, the light is ultraviolet light, by using a mercury arc lamp and exposure is for about 1.5 minutes; overall energy expended for each exposure is approximately 360 millijoules.

As will be later explained, the photoresist covering those areas 18 that are subject to the light are eventually developed away, but a technique known as "lift-off" is utilized prior to the actual development.

The wafer is soaked in chlorobenzene for about five minutes. The chlorobenzene soaks into the top surface of the photoresist material 16 that is not completely cured and decrease its solubility in those areas that were exposed to the light; that is, the surface areas 18 become less soluble to the later used developer.

After the chlorobenzene soak, the wafer is drained and the developing step takes place. The wafer is immersed in AZ developer at room temperature for approximately twice as long as the suppliers normal recommended developing time to account for the chlorobenzene soak.

Figure 3:
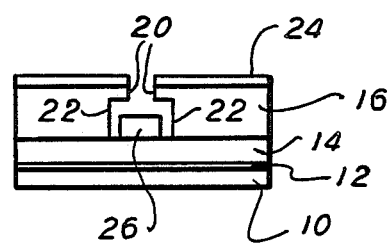
FIG. 3 is an enlarged cross sectional view illustrating one of the steps of the invention

Turning now to FIG. 3, an enlarged cross sectional view of one of the areas 18 is shown and the effect of the chlorobenzene soak can be be seen. In FIG. 3, there is shown, the base wafer 10 upon which is the silver coating 12 and the cured polyimide layer 14. The photoresist material 16 has been eaten away by the developer to form over hangs 20 in photoresist material 16 by the developer having removed more of the photoresist material 16 at the areas shown as 22. As explained, the use of chlorobenzene caused the less soluble surface area of the photoresist material 16 in areas 18 to resist the ending effect of the developer and, thus, more erosion takes place in the areas 22 beneath the surface of overhangs 20.

The completion of the developing step can be ascertained visibly and the wafer removed from the developer. The wafer is thereafter rinsed in deionized water and blown dry.

As the next step, the entire wafer is coated with aluminum in a vacuum chamber by conventional evaporation techniques. In FIG. 3, the aluminum coating 24 is approximately 1 micron in thickness and in the space where the photoresist material 16 has been removed an aluminum run 26 is formed by the evaporated aluminum passing through the overhangs 20. It is important to note that the lift off technique has left very little surface of the overhangs 20 on which the evaporized aluminum can become attached, thus, the overhangs 20 as well as the areas 22 do not become coated with aluminum, the reason for which will become apparent in the next step.

The aluminum run 26 is thus deposited directly upon the polyimide layer 14 and is in the configuration of the areas 18, referring back to FIG. 2.

Photoresist remover is next utilized in order to remove the photoresist material 16, and, with it, the aluminum coating 34, leaving only the aluminum runs 26.

Figure 4:
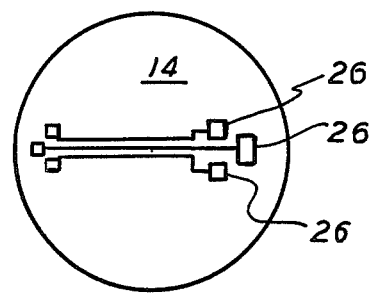
FIG. 4–10 are further plan views illustrating further sequential steps in carrying out the invention.

To effect the photoresist removal, the wafer is immersed in photoresist remover, one type of which is Shipley plate resist remover, commercially available, preferably in an ultrasonic bed so that the photoresist material 16 is completely removed. The result is shown in FIG. 4, that is, a wafer wherein the top surface is almost entirely the polyimide layer 14 upon which are formed, the aluminum runs 26.

The subsequent steps involve forming holes of approximately 2 mils in diameter through the aluminum runs 26.

Figure 5:
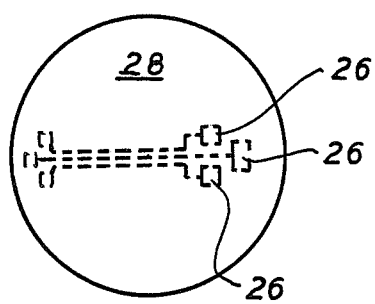
Figure 6:
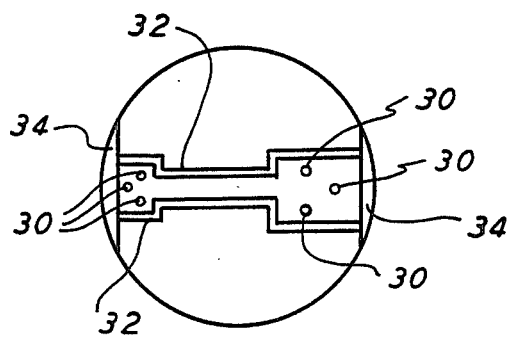

In FIG. 5, there is shown the wafer which has now been entirely plated by a chrome layer 28 by RF sputtering or comparable means with chromium of a thickness in the range of about 2000–5000 angstrom.

Again, a photoresist is spin coated on to the chrome layer 28 in the manner as previously explained and partially cured. A mask is put over the wafer that covers all of the wafer except for the minute holes 30, a small boundary 32 surrounding the periphery of the eventual microcircuit, and areas 34 at each end of the microcircuit configuration, thus it is those areas where removal of the chromium is desired. Accordingly, again using the previously explained photoresist techniques, upon the developing step any photoresist is removed from the area of the holes 30, the boundary 32 and the outer areas 34.

Figure 7:
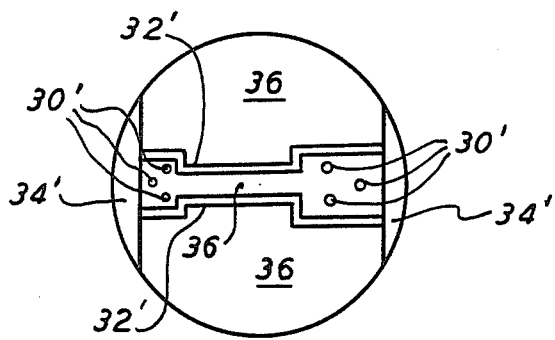

Accordingly, as now seen in FIG. 7, the outline of the eventual microcircuit is shown where the outside areas 34' are chromium, the boundaries 32' are chromium and the area 30' with in holes are chromium, the remaining area 36 is all covered by the photoresist material.

The wafer is then dipped in a conventional chromium etch where the chromium is removed. The wafer is merely dipped at room temperature in the chrome etch and visually observed that the chromium is completely removed. A typical chromium etch, many of which are suitable and some of which use ceric ammonium nitrate.

Figure 8:
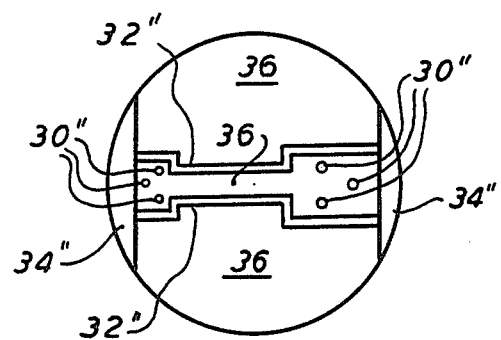

The wafer, after immersion in the chrome etch, takes on the appearance of FIG. 8 wherein the surface showing within the holes 30" is the aluminum from aluminum runs 26, the outside areas 34" now are polyimide, the boundaries 32" are also polyimide and the remaining area of the wafer is covered by the photoresist surface 36.

After washing in deionized water and according to previously described procedures, the wafer is immersed in an aluminum etch, one of which is polyphosphoric acid at about 90° C. for about 10 seconds to remove the aluminum surface within the holes 30". The removal of that aluminum can be visually perceived and the wafer rinsed and blow dried.

Figure 9:
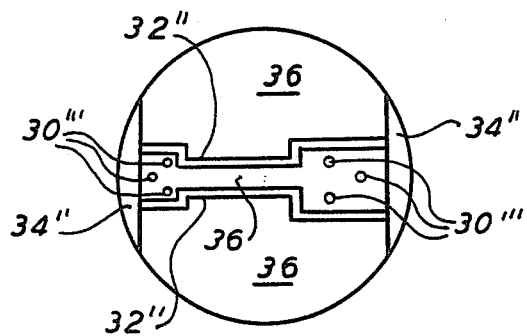

At this point, in FIG. 9, the wafer is almost the same as FIG. 8, when the end areas 34" and boundary area 32" are still polyimide surfaces, the overall area 36 is photoresist material but the holes 30' are now also down to the polyimide layer (all of the polyimide layers are the polyimide layer 14 of FIG. 1).

Figure 10:
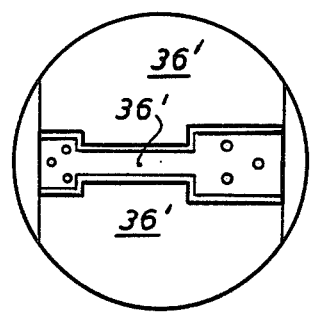

The wafer is then subjected to photoresist remover and which removes all of the photoresist material 36 leaving, as shown in FIG. 10, the surface 36' as chromium, the remaining areas, 30", 32", 34" down to the polyimide material 14 (FIG. 1). Again, the wafer is rinsed in water and blown dry.

A polyimide etch next takes place in a vacuum system and when oxygen is leaked back into the system and which acts to the erode the polyimide at a faster rate than the metals. Accordingly, the polyimide surface is reduced by erosion.

Finally, the wafer is again dipped into a chrome etch at room temperature, and the etch maybe the same as previously described. The chrome etch removes the top surface 36' (FIG 10) on top of the microcircuit, thereby exposing the aluminum runs 26 (not shown in FIG. 10) and which etch also eats through the underlying silver coating 12 (not shown in FIG. 10). Accordingly, the microcircuit is eventually undercut by the etch and it lifts off the surface of the wafer.

Figure 11:
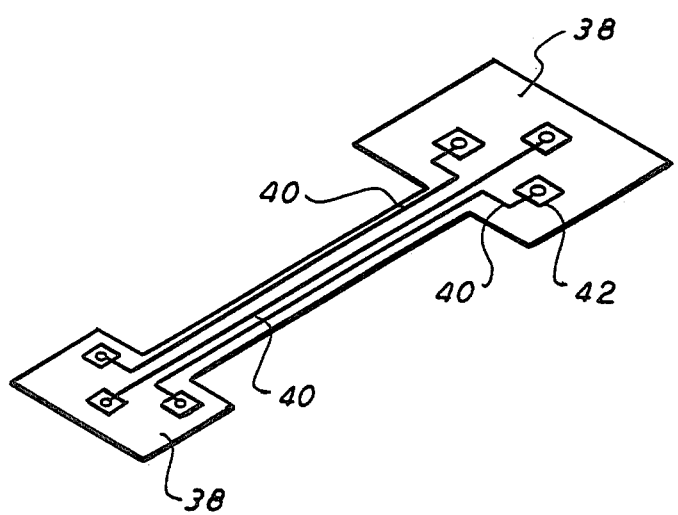
FIG. 11 is a perspective view of a completed microcircuit produced by carrying out the invention process.

As shown in FIG. 11, therefore, the flexible microcircuit is a polyimide base 38; having thereon, conductive aluminum runs 40 including contact areas 42, one end of which has holes approximately 16 mils in diameter and is sufficiently large for hard wiring to electronic apparatus and the other end has holes approximately 2 mils in diameter and is suitable for attaching a microchip.

We claim:

1. A method of making a flexible microcircuit having a plurality of holes for electrical connections and having conductive runs joining the holes comprising the steps of:
   a. coating base polyimide material on to a substrate,
   b. creating a photoresist mask surface on the base polyimide in all area's except where conductive runs are desired,
   c. coating aluminum over the entire polyimide surface,
   d. removing the photoresist mask surface to remove the aluminum coating in all areas but the desired aluminum runs on the polyimide surface,
   e. coating the entire polyimide surface and aluminum runs with chromium,
   f. creating a photoresist mask surface of predetermined shape on the chromium surface outlining the desired form of the flexible microcircuit and desired holes in the aluminum runs,
   g. removing the chromium in the areas outlining the microcircuit and at the desired holes to be formed in the aluminum runs, thereby exposing a portion of the aluminum runs in the shape of the desired holes,
   h. removing the exposed aluminum in the shape of the desired holes, thereby exposing the polyimide material in the shape of the desired holes,
   i. removing the exposed polyimide to create the desired holes through the polyimide,
   j. removing the chrome surface to thus remove the polyimide microcircuit from the substrate.

2. A method of making a flexible microcircuit as defined in claim 1 wherein said step of coating base polyimide material comprises spin coating said polyimide to a uniform thickness of about 1-2 mils on a silicon substrate.

3. A method of making a flexible microcircuit defined in claim 1 wherein said step of coating aluminum comprises evaporation coating said aluminum to a uniform thickness of about 1 micron.

4. A method of making a flexible microcircuit defined in claim 1 wherein said step of removing the chromium comprises utilizing a chromium etch containing ceric ammonium nitrate.

5. A method of making a flexible microcircuit as defined in claim 1 wherein said steps (a)-(j) form a plurality of flexible microcircuits on a silicon wafer.

* * * * *